United States Patent [19]

Fujita et al.

[11] Patent Number: 4,632,711
[45] Date of Patent: Dec. 30, 1986

[54] VAPOR PHASE EPITAXIAL GROWTH METHOD OF ZINC SELENIDE AND ZINC SELENIDE-SULPHIDE BY ORGANOMETALLIC CHEMICAL VAPOR DEPOSITION

[75] Inventors: Shigeo Fujita, Kyoto; Yoshinobu Matsuda, Ashiya; Akio Sasaki, Kyoto, all of Japan

[73] Assignee: Sumitomo Chemical Company, Limited, Osaka, Japan

[21] Appl. No.: 707,143

[22] Filed: Mar. 1, 1985

[30] Foreign Application Priority Data

Apr. 9, 1984 [JP] Japan .................................. 59-71610

[51] Int. Cl.[4] ..................... H01L 21/365; H01L 29/22
[52] U.S. Cl. .................................. 148/175; 29/576 E; 148/DIG. 63; 148/DIG. 64; 148/DIG. 110; 156/610; 156/613; 156/614; 156/DIG. 72; 156/DIG. 77
[58] Field of Search ..... 148/175, DIG. 110, DIG. 63, 148/DIG. 64; 29/576 E; 156/612-614, 610, DIG. 72, DIG. 77

[56] References Cited

U.S. PATENT DOCUMENTS

| | | | |
|---|---|---|---|
| 3,218,203 | 11/1965 | Ruehrwein | 148/175 |
| 3,224,912 | 12/1965 | Ruehrwein | 148/175 |
| 3,312,571 | 4/1967 | Ruehrwein | 156/614 X |
| 3,664,866 | 5/1972 | Manasevit | 148/DIG. 64 |
| 4,422,888 | 12/1983 | Stutius | 148/DIG. 110 |
| 4,509,997 | 4/1985 | Cockayne et al. | 29/576 E |

OTHER PUBLICATIONS

Yao et al, Japanese Journal of Applied Physics, 22 (1983), pp. L144-L146, "Electrical and Photo-luminescence Properties of ZnSe Thin Films . . . ".
Manasevit et al, J. Electrochem. Soc. 118 (1971), pp. 644-647, "The Use of Metal-Organics in the Preparation of Semiconductor Materials".
Preliminary Reports of the 44th Academic Meeting of the Japan Society of Applied Physics, 1983, p. 602, Conference No. 28a-N-11.
Fujita, et al, Japanese Journal of Applied Physics, vol. 22, No. 9, Sep. 1983, pp. L583-L585, "Growth of ZnS by Metalorganic Chemical Vapor Deposition".
W. Stutius; J. Crystal Growth 59 (1982), 1-9.
P. Blanconnier, J. F. Hogrel, A. M. Jean-Louis and B. Sermage; J. Appl. Phys. 52 (1981), 6895-6900.
P. J. Wright and B. Cockayne; J. Crystal Growth 59 (1982), 148-154.

*Primary Examiner*—William G. Saba
*Attorney, Agent, or Firm*—Stevens, Davis, Miller & Mosher

[57] ABSTRACT

A zinc selenide or zinc selenide-sulphide epitaxial crystal is grown at a growth temperature of about 180°-320° C. by organometallic chemical vapor deposition by using zinc alkyl and hydrogen selenide and/or hydrogen sulphide. An as-grown crystal presented an n conductivity type low resistivity and exhibited a narrow near-band gap emission peak. Besides a crystal of the same material as the epitaxial layer, crystals of group III-V, group IV, and so forth having the same or similar crystal structure as the epitaxial layer can be used as an underlayer for the growth.

2 Claims, No Drawings

VAPOR PHASE EPITAXIAL GROWTH METHOD OF ZINC SELENIDE AND ZINC SELENIDE-SULPHIDE BY ORGANOMETALLIC CHEMICAL VAPOR DEPOSITION

This invention relates to a method for epitaxially growing zinc selenide (ZnSe) or zinc selenide-sulphide (ZnSSe) mixed single crystals having excellent characteristics by organometallic chemical vapor deposition (MOCVD).

ZnSe and ZnSSe have wide band gaps at room temperature as zinc sulphide, which are greater than about 2.7 eV, which are promissing as materials enabling to construct blue light emitting devices.

Heretofore, single crystals of ZnSe and ZnS have been prepared by a crystal growth method in a high temperature region such as the melt-growth under high pressure, etc. Also epitaxial growth methods by vacuum deposition, sublimation, chemical transport, vapor phase epitaxy, liquid phase epitaxy, etc. have been studied in various respects in order to obtain high quality single crystals.

However, these methods give rise to defects, which are believed to be attributed probably to manipulations at the high temperature region and make difficult to obtain high quality single crystals. All the crystals prepared by these conventional methods present high resistivities due to the self-compensation effect, unless they are treated in a special manner, what has been a remarkable obstacle to their application to electronic devices.

Recently two prominent epitaxial crystal growth methods are tried; the molecular beam epitaxy (MBE) and MOCVD. MBE necessitates manipulations in superhigh vacuum (less than $10^{-7}$ Pa ($10^{-9}$ Torr)) and has a tendency to be restricted to the application for apparatus for research, while MOCVD is a vapor phase growth method permitting to obtain a uniform growth layer on a large area and is much expected as a crystal growth method which can be applied to industrial production. With this expectation, active studies thereon are developed and producing remarkable results as an epitaxial growth method for group III-V compound semiconductors. However, when this MOCVD is applied to group II-VI compound semiconductors, such as ZnSe and ZnS, this method implies intrinsic difficulties due to the self-compensation effect stated above.

T. Yao et al. (Japanese Journal of Applied Physics 22 (1983) p. L144–L146) have obtained an undoped low resistivity ZnSe epitaxial growth layer by MBE described above. However, by MOCVD; according to the reports of W. Stutius (Journal of Crystal Growth 59 (1982) p. 1–9), P. Blanconnier et al. (Journal of Applied Physics 52 (1981) p. 6895–6900), P. J. Wright et al. (Journal of Crystal Growth 59 (1982) p. 148–154) and so forth, up to this time no undoped low resistivity ZnSe epitaxial growth layers have been obtained yet.

The inventors of this invention have devoted themselves to research on undoped crystal growth by MOCVD as a preliminary study for obtaining p and n conductivity type ZnSe and ZnSSe, which are necessary to fabrication of various electronic devices. As the result they have found that it is possible to obtain low resistivity epitaxial single crystals of ZnSe and ZnSSe having strong near band-edge emission at room temperature by growing epitaxial single crystals at a low temperature and reached this invention.

According to one aspect of this invention, is provided a method for epitaxially growing zinc selenide or zinc selenide-sulphide mixed single crystals characterized in that zinc alkyl and hydrogen selenide or hydrogen sulphide together with them are used as starting materials and the epitaxial growth is carried out at a growth temperature between 180° and 320° C. for epitaxially growing a zinc selenide or zinc selenide-sulphide mixed single crystal on a substrate by the organometallic chemical vapor deposition epitaxial growth method.

The ZnSe and ZnSSe single crystals, which are epitaxially grown by MOCVD according to this invention, present an n (conductivity) type low resistivity, in as-grown state without any special treatment after the growth.

Hereinbelow this invention will be explained more in detail.

As an MOCVD system or apparatus of the type used for crystal growth according to this invention, a reaction system for group II-VI MOCVD proposed by H. M. Manasevit is known (Journal of Electrochemical Society 118 (1971) 644). Since the organo zinc compound, which is starting material of zinc (Zn), reacts easily at room temperature with hydrogen sulphide ($H_2S$) and hydrogen selenide ($H_2Se$), which are starting materials of sulphor (S) and selenium (Se) respectively, the proposed system is so constructed that these starting materials can be separately supplied so that they are mixed just before the substrate. It is preferable to use an apparatus, in which the introduction tube for supplying the organo zinc compound is prolonged as far as just before the substrate, as proposed by the inventors of this invention (Preliminary Reports of the 44th Academic Meeting of the Japan Society of Applied Physics 1983, p. 9602, conference number 28a-N-11). More preferably, an apparatus provided with a jacket for cooling the organo zinc introduction tube can be used.

In general, organometallic compounds used for MOCVD are thermally decomposed easily. For example, it is reported that thermal decomposition of dimethyl zinc (($CH_3$)$_2$Zn, DMZ) begins at 150° C. When the organo zinc introduction tube is heated to a temperature higher than this value, it may decompose by itself. Zn atoms produced by the thermal decomposition are clustered and are supplied to the substrate depending on an equilibrium determined by the temperature and the pressure. The saturation vapor pressure of Zn is $1.3 \times 10^{-2}$ Pa (0.1 mTorr). When the partial pressure of the Zn atoms becomes higher than this value, Zn atoms will not be supplied effectively so that the characteristics of MOCVD using organo zinc compound as a starting material are no more valid. Furthermore microcrystals produced at the heated part of the introduction tube may deposit on the substrate and it is also thinkable that they deteriorate the uniformity of the epitaxial layer.

With regard to the direction of the reaction vessel, either vertical or horizontal type can be used. However, a vertical type vessel can be used preferably, taking the uniformity of the growth layer and development into a mass production apparatus into account.

Various method are known for heating the reaction vessel and any of them can be used therefor. For the radio frequency (rf) induction heating method, which is often applied to MOCVD for group III-V compound semiconductors, it is believed that an ingenious contrivance is necessary for the temperature control at low temperature. Further, in the case where crystal growth is carried out, under a reduced pressure, it is believed that, depending on crystal growth conditions, it becomes necessary to prevent electric discharge.

The halogen transport method, which is a conventional vapor phase crystal growth method, necessitates more than two different temperature zones, while it is one of the most important features of MOCVD that it is carried out by heating only the proximity of the substrate. In order to heat only the substrate, a method, by which the substrate is located on a graphite pedestal heated by rf induction described above, is often used. However, the substrate can be heated by any method such as the resistance heating method for which an ordinary heater is incorporated in the pedestal, the infrared heating method, the method by which the substrate is heated from the exterior by means of an electric furnace surrounding the reaction vessel, etc. Further, it is often executed also that the uniformity in the growth layer is ameliorated by rotating the pedestal. Attention should be payed, which is similar to that for a usual MOCVD system, that tightness of the piping for supplying the starting materials and others should be secured, that installations for treating exhaust gas should be provided, etc.

Now, the starting materials used for the crystal growth will be explained. As the Zn source, alkyl zinc compounds such as dimethyl zinc, diethyl zinc, dipropyl zinc, dibutyl zinc, etc. can be used. Among these, dimethyl zinc and diethyl zinc having an appropriate vapor pressure are preferable. As the selenium source, hydrogen selenide is used and as the sulfur source, hydrogen sulphide is preferably used. Zinc dialkyl is contained in an exclusive-use bubbler made of stainless steel, because it has a very high reactivity and reacts explosively with air or water. It is recommended to supply it from this bubbler by being carried by a carrier gas. In the case where a compound having a high vapor pressure such as dimethyl zinc is used, it is also possible to dilute it previously with carrier gas in a gaseous state, to fill a pressure vessel and to supply it therefrom. Hydrogen selenide and hydrogen sulphide are very toxic gases, and therefore attentive manipulation is necessary. Consequently, in order to reduce dangerousness and to control the supply amount with a higher precision, it is usually preferable to fill a pressure vessel with gas diluted to 5–10% with carrier gas and to supply it therefrom. Depending on the pressure etc., dilution may extend from 10 ppm to 10%. As carrier gas, hydrogen, helium, argon, nitrogen and so forth can be used. However it is recommended to use hydrogen. It is also recommended to purity hydrogen by diffusing it through a palladium film, because it is important to use extremely high purity starting materials for fabrication of semiconductor devices. The amount of supplied zinc dialkyl can be widely varied depending on the temperature of the substrate, the dilution ratio by carrier gas, the pressure in the reaction vessel and the desired crystal growth rate, but a supply rate in a region of $10^{-6}$ to $10^{-3}$ mol/min is recommended. The supply amount of hydrogen selenide and hydrogen sulphide can be widely varied similarly to that of zinc dialkyl, but a supply rate of $10^{-6}$–$10^{-2}$ mol/min is recommended. The ratio of the supply amount of zinc dialkyl (Group II) to that of hydrogen selenide and hydrogen sulphide (Group VI), (Group II)/(Group VI) can be varied in a region 1/100–10/1 (mol ratio), but a ratio of 1/10–3/1 (mol ratio) is recommended. The dilution percentage is e.g. about 16%, in the case of dimethyl zinc, when the temperature of the bubbler is kept at 0° C. so that the saturated vapor pressure is then about $164 \times 10^2$ Pa (123 Torr) and when the pressure of the mixed gas after bubbling with carrier gas is $1.01 \times 10^5$ Pa (760 Torr). For MOCVD under the normal pressure condition, these gases used as starting materials are diluted with a large amount of carrier gas supplied through a separate line. For MOCVD under the reduced pressure condition, the supply amount of the carrier gas is regulated depending on the determined pressure and the power of the used evacuation system. Since the crystallinity has a tendency to be ameliorated, when the crystal growth rate decreases, it is recommended to choose a crystal growth rate as small as possible within a practically allowable region. The rate measured in thickness of 0.1–10 μm/hr is desirable in practice. It is also important to set the temperature of the substrate within a region between 180° and 320° C. Heretofore, for MOCVD, research has been effected for temperatures of the substrate higher than 350° C. because of problems to be solved on the performance of the crystal growth apparatus. It is surprising that it is possible to obtain crystals having excellent properties by MOCVD at a low temperature.

A crystal used as a substrate is most preferably ZnSe or ZnSSe with the same composition as epitaxial growth, but high quality single crystals thereof are hardly available. Gallium arsenide (GaAs), gallium phosphide (GaP), germanium (Ge), silicon (Si), etc., which belong also to the zinc blende or diamond type cubic crystal structure, can be used, too. Among them GaAs and GaP are recommended, but with respect to lattice matching, GaAs is preferable.

According to this invention, single crystals of ZnSe and ZnSSe epitaxially grown under the conditions described above have low resistivities of the n conductivity type in as-grown state, i.e. by using organo zinc compound, H$_2$Se and H$_2$S carried by a carrier gas, which are starting materials, with no impurity added thereto. That is, the result of a Hall measurement by the Van der Pauw method shows a resistivity of $10$–$10^{-3}$ Ωcm at room temperature. Further, in a photoluminescence measurement under a weak excitation condition by means of a superhigh pressure mercury lamp of 500 W at room temperature, a crystal made by the method according to this invention shows strong near band-edge emission, e.g. at 461 nm for ZnSe. The realization of the above-mentioned low resistivity and strong near band-edge emission was impossible in any of the conventional methods.

In one application of this invention a p conductivity type semiconductor body is used as the substrate crystal and a p-n junction is formed, when a low resistivity n conductivity type ZnSe or ZnSSe layer is grown thereon according to this invention, which p-n junction can be applied to the fabrication of an electronic device. A hetero p-n junction is formed, when a p conductivity type gallium arsenide (GaAs) body is used as the substrate, because at present it is not easy to obtain low resistivity p conductivity type ZnSe and ZnSSe.

It is also possible to obtain an MIS (metal-insulator-semiconductor) structure device by forming an insulating layer on a low resistivity n conductivity type ZnSe or ZnSSe epitaxial single crystal grown according to this invention and further by depositing a metal layer thereon.

Hereinbelow this invention will be explained concretely, referring to some preferred embodiments, which however don't restrict this invention in any way.

EMBODIMENT 1

A reduced pressure MOCVD apparatus (SAMCO International Co., MCV 1030A) is used for epitaxial crystal growth, which apparatus is illustrated in Japanese Journal of Applied Physics 22 (1983) p. L 583, FIG. 1. In this embodiment the organo metal introduction tube was provided with a water cooling jacket and cooled. Starting materials which are to be supplied are dimethyl zinc (($CH_3)_2Zn$, abbreviated to DMZ) (made by Sumitomo Chemical Industry Co., Ltd.) and hydrogen selenide ($H_2Se$) (made by Seitetsu Kagaku Kogyo Co., Ltd.) diluted to 5% by hydrogen. DMZ was contained by an exclusive-use bubbler made of stainless steel SUS, which was immersed in an ice bath at 0° C., and transported by hydrogen gas purified by means of a hydrogen purification apparatus (made by Japan Pionics Co., Ltd.). A (100) surface of a semi-insulating gallium arsenide wafer doped with chromium (GaAs doped with Cr, made by Sumitomo Electric Industries Ltd., $\geq 10^8$ ($\Omega$cm)) was used as the substrate. After the wafer was scribed into a plurality of chips of 10 mm×10 mm, they were immersed in aceton of electronics grade (made by Nakarai Chemicals Ltd., hereinbelow chemicals of electronics grade were used, unless otherwise indicated) contained in a clean 30 cc beaker and scraps, etc. were removed by ultrasonic cleaning and decantation. After they were degreased by boiling a mixed solvent of trichloroethylene and aceton with them in it, they were transferred into a clean 30 cc beaker filled with methanol by means of an exclusive-use pincette. After boiling, they were again transferred into a clean 30 cc beaker filled with DAIFLON (registered trade mark, made by Daikin Industries Ltd.) by means of an exclusive-use pincette. After substitution of the solvent, they were taken out and dried rapidly. During this period an etching solution of $H_2SO_4:H_2O_2:H_2O=5:1:1$ was prepared in another clean 30 cc beaker and kept to 40° C. The dried substrates were thrown promptly in the etching solution, and then the beaker was shaken for 2 minutes for etching. After the major part of the etching solution was removed by decantation, methanol was poured in the beaker in order to stop the etching. After the etching solution was sufficiently replaced by methanol, the methanol was boiled with the substrates and then they were transferred into a beaker filled with DAIFLON by means of a pincette. The substrates taken out from the DAIFLON were dried promptly and immediately thereafter substrates were loaded on the susceptor in the crystal growth apparatus. The substrate thus treated was displaced in the reaction vessel and located at 30 mm from the outlet of the organo metal introduction tube. The substrates were heated to 550° C. before the beginning of crystal growth reaction. Substrate temperature is measured by a Pt: Pt-13% Rh thermocouple welded directly on the pedestal. After having been kept at 550° C. for 5 minutes, the temperature was lowered and regulated at 250° C., which was the crystal growth temperature. During this operation, hydrogen gas was let flow at a rate of 50 ml/min. At this time the pressure in the reaction vessel was 21.8 Pa (160 mTorr). The crystal growth reaction was begun by introducing at first $H_2S$ at a flow rate of $9.6 \times 10^{-5}$ mol/min and immediately thereafter DMZ at a rate of $3.2 \times 10^{-5}$ mol/min. The pressure at this time in the reaction vessel was 16.0 Pa (120 mTorr). After one hour elapsed, the crystal growth reaction was terminated by stopping the supply of the starting materials DMZ and $H_2Se$ in this order. After the termination of the reaction, a light yellow film deposited at a portion of the same height as the substrate in the reaction vessel was observed. The surface of the sample epitaxially grown was mirror-surface-like and as far as it was observed with the naked eye, it had a good flatness.

This epitaxial wafer was cleaved at a (110) plane and observed by means of a Nomarski differential interference microscope. The epitaxial layer was 2.0 $\mu$m thick and an even cleavage surface was observed. When it was observed with a magnification of 1000, undulation along the cleavage direction of <110> was found. When diffraction from (400) planes by the X-ray diffraction was measured, $K\alpha_1$ and $K\alpha_2$ lines of ZnSe were clearly separated from each other ($K\alpha_1$ line of the GaAs substrate is superposed on the latter). $2\theta$ value of $K\alpha_1$ line of ZnSe obtained by using the GaAs substrate as reference is 65.85°. The lattice constant $0.5668^4$ nm calculated starting therefrom is in accordance with the value in the literature $0.5668^7$ nm (II-VI Compound Semiconductor Crystal Data Book, Nippon Denshi Kogyo Shinko Kyokai (Japanese Electronic Industry Promotion Association), 1983). A rocking curve on the orientation was obtained by varying $\theta$, fixing at $2\theta=65.85°$. The full width at half maximum (FWHM) of this rocking curve was 0.15°. FWHM was measured for GaAs, which was the substrate, in the same way by means of this X-ray diffraction apparatus and a value of 0.15° was obtained. Since this value is the detection limit of the used measuring apparatus, it was concluded that the crystallinity of the obtained epitaxial ZnSe layer was sufficiently good within the precision of the evaluation.

A measurement by the reflected high energy electron diffraction (RHEED) was also effected and the Kikuchi band was observed. Thus, it was confirmed that the crystallinity was good.

Photoluminescence measurement

The measurement of the photoluminescence (PL) was carried out by the lock-in technique by using a 500 W superhigh pressure mercury lamp as the excitation light source and by taking out a bright line of 365 nm through a filter UV-DIC. By the PL measurement at room temperature for a sample thus prepared strong emission at 461 nm was observed. Although broad emission peak originating from a deep energy level was observed at the side of longer wavelength, the very intense blue emission band having a peak at 461 nm was characteristic. The intensity ratio of these emissions depends on the excitation intensity, and the blue emission intensity increases considerably with increasing excitation intensity. By the PL spectra measured at 4.2K a sharp emission peak was observed at 2.798 eV (443.1 nm) and emissions at about 460 nm and 475 nm, which are found for samples grown at high temperatures, didn't appear.

Measurement of electric properties

A Hall measurement for a sample obtained by the method described above was effected. Ohmic electrodes were formed by using an alloy of indium and mercury (In/Hg) and by heating it to 200° C. for 2 minutes in a hydrogen atmosphere. As the result, was obtained an n conductivity type semiconductor layer having a resistivity $\rho$ at room temperature of 0.36 $\Omega$.cm, a carrier density n of $0.82 \times 10^{17}$ cm$^{-3}$ and a mobility $\mu$ of 244 cm$^2$/V.sec.

Heretofore no ZnSe single crystals epitaxially grown by MOCVD, undoped and as grown, have shown such a low resistivity, and thus the effect of this invention characterized by the low temperature growth is clear.

EXAMPLE FOR COMPARISON 1

A ZnSe layer was epitaxially grown on a (100) plane of a semi-insulating GaAs substrate under the same conditions as those described in Embodiment 1 except for the crystal growth temperature, which was changed to 350° C. Almost no differences were found in the appearance, the morphology observed by means of the Nomalsky differential interference microscope, and the aspect of a cleavage surface (110) with respect of the sample grown at 250° C. The epitaxial layer was 1.5 $\mu$m thick and thinner than that grown at 250° C. It is believed that the decrease of the growth rate caused by the increase of the growth temperature can be attributed to the fact that re-evaporation reaction is produced due to the high vapor pressure of the elements constituting the single crystal so that the adhesion coefficient decreases. The resolution between $K\alpha_1$ and $K\alpha_2$ in X-ray diffraction peaks was clear. FWHM of the rocking curve was 0.15° and therefore no difference was observed with respect to that obtained for the sample grown at 250° C. Although no differences were found in the evaluation of the crystallinity by X-ray diffraction, no emission was observed in the PL measurement for this sample at room temperature. The whole surface of the sample was rather blackish and the reflection of the excitation light was weak.

Next, Hall effect measurement was tried, but in vain: ohmic electrodes were formed in the same manner as in Embodiment 1, conduction among the electrodes was checked and it was found that they were not conductive. Therefore, the temperature for the formation of the ohmic electrodes was raised to 350° C. and this temperature was kept for 2 minutes. But they were still not conductive at all.

EXAMPLE FOR COMPARISON 2

A ZnSe layer was epitaxially grown on a (100) plane of a semi-insulating GaAs substrate under the same conditions as those described in Embodiment 1 except that the growth temperature was lowered to 150° C. and that the growth period was prolonged to 8 hours. Although the surface of the sample thus obtained was flat when it was observed with the naked eye, it was whitish, and the brilliance was inferior to that of the sample grown at 250° C. A cleavage surface (110) observed by means of the Nomarski differential interference microscope showed unevenness of the epitaxially grown layer. It was also observed there that pyramid-shaped structures, whose length in the diagonal direction was about 4 $\mu$m, were arranged regularly and thus the surface was clearly different from that of the sample grown at 250° C. The epitaxial layer was 4.2 $\mu$m thick.

In its X-ray diffraction pattern, although the separation of $K\alpha_1$ and $K\alpha_2$ was observed, the diffraction intensity was weak with respect to the thickness of the layer and the spectra was broad. FWHM of the rocking curve was 0.85°. In RHEED, besides distinct spot patterns, slight ring patterns were observed, and thus it was recognized that the crystallinity was not satisfactory. In the PL measurement at room temperature strong vermillion emission was observed and the near band-edge emission was very small. In the case of the PL at 77K the emission became yellowish orange and the near band-edge emission at about 445 nm became intense, but the emission having 2 broad peaks at the side of longer wavelength was predominantly strong.

Ohmic electrodes were formed for this sample in the same manner as in Embodiment 1 and conduction among the electrodes was checked. Although slight conduction was observed, the resistance was too high to be used for a usual Hall measurement. Consequently it was heated to 350° C. and this temperature was maintained for 2 minutes as in Example for Comparison 1. As the result, the conduction disappeared. Thus, it was known that it is impossible to obtain any high quality ZnSe epitaxial layer at a growth temperature of 150° C.

EXAMPLE FOR COMPARISON 3

A ZnSe layer was epitaxially grown on a (100) plane of a semi-insulating GaAs substrate under the same conditions as those described in Embodiment 1 except that the growth temperature was raised to 550° C. The sample thus obtained showed bluish green interference color and had a mirror surface having a good flatness. A cleavage surface (110) observed by means of the Nomarski differential interference microscope had no unevenness and was well flat. On the surface, an orange-peel-like fine structure was observed. When it was observed with a still greater magnification by means of a scanning electron microscope, undulation along <110> was found and the surface bore a resemblance to that of the sample grown at 250° C. The epitaxially grown layer was 0.25 $\mu$m thick.

In its X-ray diffraction pattern, although the separation of $K\alpha_1$ and $K\alpha_2$ was observed, the diffraction intensity was weak and their peaks were broad probably because of the small thickness of the layer. However, FWHM of the rocking curve was 0.15° and it was recognized that the crystallinity was as good as that of the sample grown at 250° C. In PL at room temperature, slight red emission was observed, but its intensity was low and no peak in the neighborhood of the absorption edge was recognized. On PL at 4.2K, exciton emission and donor-acceptor-pair emission at about 460 nm were predominant, and no near band-edge emission was observed. Formation of ohmic electrodes was tried also for this sample, but no conduction was observed at all.

It was found, as indicated in this example for comparison, that the epitaxial layer grown at a high temperature had a high resisitivity and did not show the near band-edge emission.

EMBODIMENT 2

A ZnSe layer was epitaxially grown for one and a half hours at a growth temperature of 550° C. on a (100) plane of a semi-insulating GaAs substrate in the same manner as in Example for Comparison 3. After that the supply of dimethyl zinc and hydrogen selenide was once stopped. Then the temperature of the substrate was lowered and regulated to 250° C. while supplying hydrogen gas at a rate of 50 ml/min. After the temperature was set at 250° C., dimethyl zinc and hydrogen selenide were supplied again under the same condition for the epitaxial growth for 1 hour. The sample thus obtained had an appearance which was very similar to that of the sample obtained in Embodiment 1. The layer was 2.1 $\mu$m thick. FWHM of the rocking curve in the X-ray diffraction was 0.25°, what showed that the crystallinity was worsened with respect to the sample in Embodiment 1. In PL at room temperature, strong near band-edge emission appeared at 461 nm. In the PL spectra at 4.2K a sharp emission peak was observed at 2.798 eV (443.1 nm) just as for the sample in Embodiment 1, but FWHM of the peak was twice as large as that of the latter. The result of a Hall measurement effected in the same manner as in Embodiment 1 showed an n conductivity type low resistivity $\rho$ at room temperature of 24 $\Omega$cm, a carrier density of $0.4 \times 10^{17}$ cm$^{-3}$ and a mobility of 68 cm$^2$/V.sec.

Comparing these values with those obtained in Example for Comparison 3, it was recognized that the second epitaxial layer grown at 250° C. without any doping or any further treatment (i.e. in as-grown state) is attributable to the features of the low resistivity and the strong near bandgap emission. It is clear also by these operations that the invention can be effectively applied in practice.

EXAMPLE FOR COMPARISON 4

A reduced pressure MOCVD apparatus (SAMCO, MCV 1030A) having no water-cooled jacket on an organometal introduction pipe was used to grow an epitaxial layer. The growth conditions were set to be identical with those of Embodiment 2 except the absence of the water-cooled jacket. The reaction tube was inspected after the reaction. It was observed that brownish thin films were deposited in areas of a height of about 10 cm around the substrate level and a length of about 10 cm from the tip of the organometal introducing pipe. It was also observed that the thin film on the organometal introducing pipe was partially peeled off and fell on the substrates. After the experiment, it was further observed upon cleaning the reaction tube, a brownish thin film deposited also on the inner wall of the organometal introducing pipe and peeled off in large areas. The surface of the substrate was mirror-like, but had some projections probably due to particles. This substrate was cleaned along (110) plane and was observed by Nomarski differential interference microscope. It was observed that some particles were embedded in the grown layer. When the emission distribution of this substrate was observed upon PL measurement, non-uniformity of emission in the surface was observed. Such non-uniformity was not observed in the substrate grown by Embodiment 2. These differences are considered to be ascribed to the absence of water-cooling for the introduction of organometal.

EMBODIMENT 3

In this Embodiment the effectiveness of this invention will be shown for the epitaxial growth of a zinc selenide-sulphide (ZnSSe) mixed crystal.

A ZnSSe layer was epitaxially grown on a (100) plane of a semi-insulating GaAs substrate in the same manner as in Embodiment 1 except that H$_2$S was introduced at a rate of $9.6 \times 10^{-5}$ mol/min at the same time as H$_2$Se at a rate of $9.6 \times 10^{-5}$ mol/min as starting materials of the group VI. At this time the pressure in the reaction vessel was 21.9 Pa (165 mTorr). The appearance of the sample thus obtained was almost the same as that of the sample in Embodiment 1. A cleavage surface (110) of the epitaxial growth layer was as even and flat as that of the substrate. The epitaxial growth layer was 2.0 $\mu$m thick. In the X-ray diffraction pattern three peaks could be no more observed in the corresponding $2\theta$ region, but there were only two peaks corresponding to the diffraction pattern of the GaAs substrate. This doesn't mean that diffraction originating from the epitaxial ZnSSe layer is absent, but this is due to the fact that its lattice constant perfectly agrees with that of the substrate. In PL at room temperature a strong near band-edge emission appeared at 452 nm. In PL at 77K, a strong emission peak appeared at 437.5 nm. In PL at 4.2K a strong peak appeared at 436.8 nm and no emission other than this peak was observed. Comparing these results with those of Embodiment 1 it can be recognized that the energy of this emission peak shifted to the higher energy side, indicating that the energy gap of the single crystal epitaxial layer was enlarged. Hall measurements were effected on this sample in the same manner as in Embodiment 1.

The results showed an n type low resistivity $\rho$ of 0.37 $\Omega$.cm, a carrier density of $1.3 \times 10^{17}$ cm$^{-3}$ and a mobility of 132 cm$^2$/V.sec at room temperature.

Thus, also for the epitaxial growth of ZnSSe, it is recognized that it is possible to obtain single crystals having low resistivities and presenting strong near band-edge emissions at room temperature by growing them at 250° C.

We claim:

1. A method for epitaxially growing a zinc selenide single crystal or a zinc selenide-sulphide mixed single crystal by organometallic chemical vapor deposition epitaxial growth, comprising the steps of:
    providing a mixture of zinc alkyl and hydrogen selenide, or a mixture of zinc alkyl, hydrogen selenide and hydrogen sulphide, as starting materials for growing a zinc selenide or a zinc selenide-sulphide single crystal, respectively;
    supplying said starting materials to a reaction vessel, said reaction vessel having a substrate on which the crystal is to be grown, at a rate of $10^{-3}$ to $10^{-6}$ mole per min of the zinc alkyl and $10^{-2}$ to $10^{-6}$ mole per min of hydrogen selenide or a mixture of hydrogen selenide and hydrogen sulphide, the molar ratio of the zinc alkyl to hydrogen selenide or to the mixture of hydrogen selenide and hydrogen sulphide being within the range of 1/100 to 10/1; and
    growing a zinc selenide or a zinc selenide-sulphide epitaxial crystal on the said substrate at a temperature between 180° and 320° C.

2. A method according to claim 1, wherein the zinc alkyl is dimethyl zinc or diethyl zinc.

* * * * *